US006611435B2

(12) United States Patent
Kumar et al.

(10) Patent No.: US 6,611,435 B2
(45) Date of Patent: Aug. 26, 2003

(54) VOLTAGE REGULATOR WITH VOLTAGE DROOP COMPENSATION

(75) Inventors: Pavan Kumar, Portland, OR (US); Lilly Huang, Portland, OR (US)

(73) Assignee: Intel Corporation, Santa Clara, CA (US)

(*) Notice: Subject to any disclaimer, the term of this patent is extended or adjusted under 35 U.S.C. 154(b) by 75 days.

(21) Appl. No.: 10/042,773

(22) Filed: Jan. 8, 2002

(65) Prior Publication Data

US 2003/0128017 A1 Jul. 10, 2003

(51) Int. Cl.[7] ............................................. H05K 7/02
(52) U.S. Cl. .................... 361/807; 361/690; 713/300
(58) Field of Search ................... 361/690, 784, 361/18, 794, 92, 809, 807; 713/300; 439/342, 368, 65, 69; 327/565; 323/293

(56) References Cited

U.S. PATENT DOCUMENTS 5,481,436 A  * 1/1996 Werther ...................... 361/784
5,883,790 A  * 3/1999 Klein ......................... 361/809

* cited by examiner

*Primary Examiner*—Shawn Riley
(74) *Attorney, Agent, or Firm*—Fish & Richardson P.C.

(57) ABSTRACT

A power delivery device includes a socket to couple and deliver power to an electronic component. A voltage control sensor is coupled to the socket to sense an output voltage at the socket and to provide negative feedback control. An impedance of the socket and an associated baseboard is incorporated into the negative feedback control and may help compensate for voltage droop in the output voltage.

17 Claims, 3 Drawing Sheets

VOLTAGE REGULATOR WITH VOLTAGE DROOP COMPENSATION

BACKGROUND

This invention relates to a voltage regulator with voltage droop compensation.

A voltage regulator on a baseboard can provide power to a central processing unit (CPU). To drive today's powerful CPUs, more power and current are needed. However, with increased power delivery to the CPU, static and transient voltage droop have become more significant problems. Voltage droop refers to a drop in the voltage in response to a CPU load. A transient voltage droop may occur as an initial drop in voltage when power is supplied to a CPU or when a load changes. A static voltage droop indicates a drop in voltage that is constant over time.

DETAILED DESCRIPTION

Figure 1:
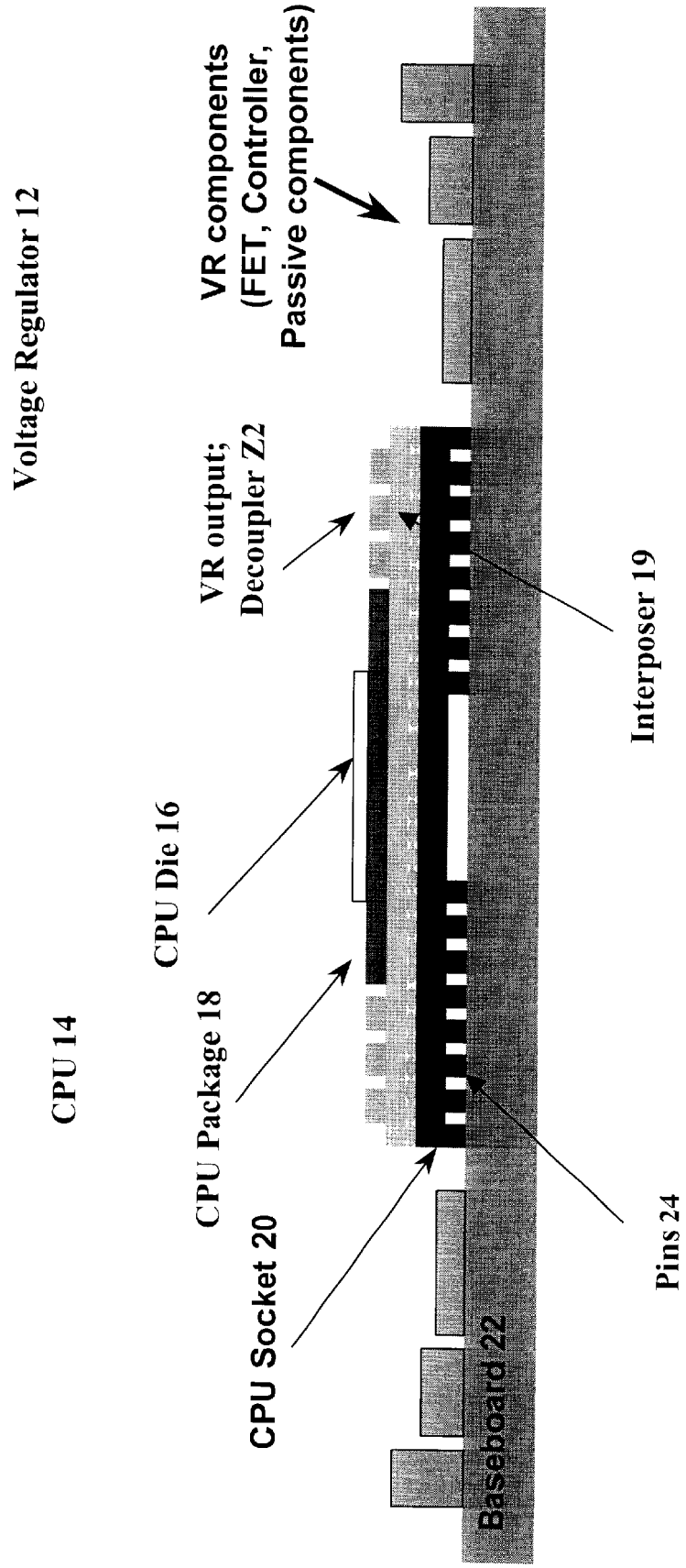
FIG. 1 shows a power delivery system according to an embodiment of the invention.

FIG. 1 shows a power delivery system 10 that supplies power from a voltage regulator 12 to a CPU 14. The CPU 14 is composed of a die 16 and a package 18. The CPU 14 is anchored through an interposer 19 on a socket 20 which sits on a baseboard 22. Pins 24 that extend from the socket 20 attach to the baseboard 22 for electrical connection. Components of the voltage regulator 12, such as field effect transistors, controllers, and passive components such as filter capacitors and inductors, can be distributed on the baseboard 22 and on the socket 20.

Figure 2:
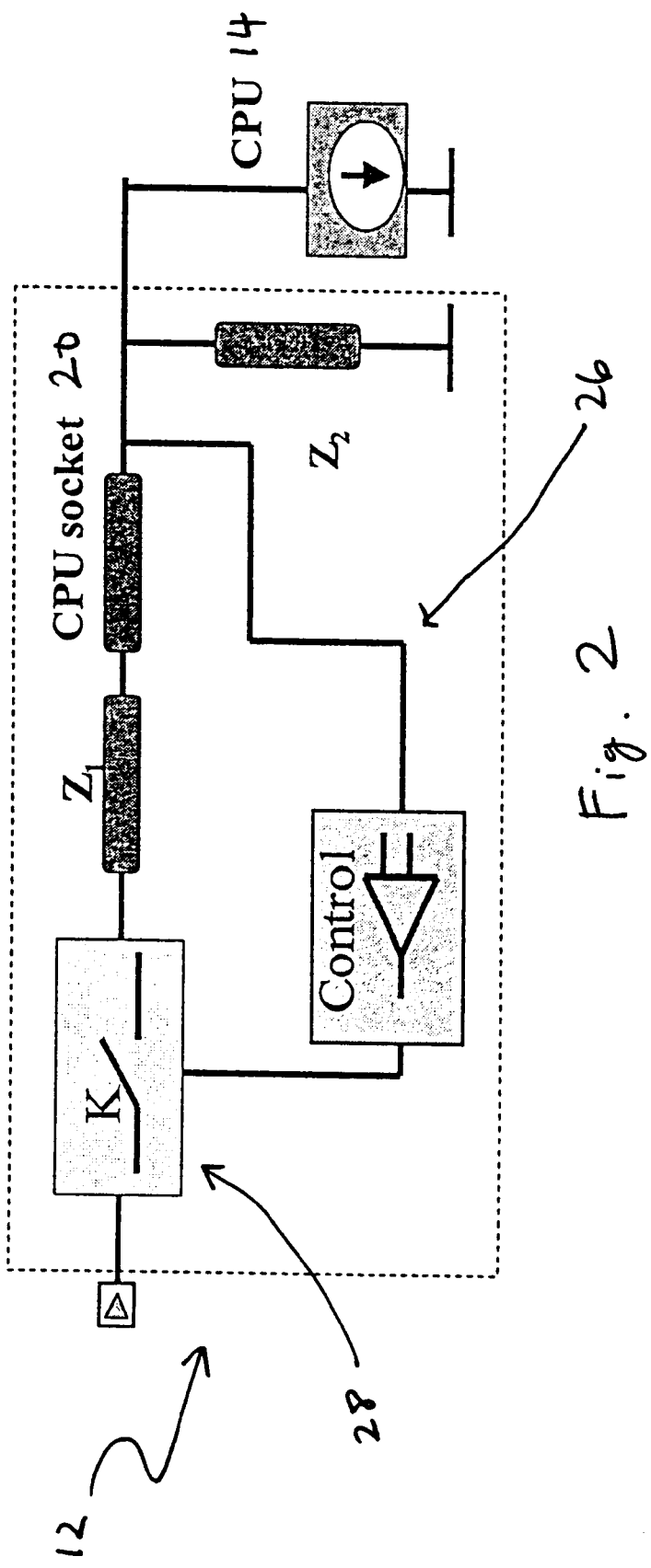
FIG. 2 shows a diagram of a power delivery system according to an embodiment of the invention.

FIG. 2 shows how the various components of the voltage regulator 12 are connected. The CPU 14 is coupled to the socket 20. A negative feedback control loop 26 is coupled at one end to the socket 20 to sense an output voltage of the voltage regulator 12 at the interface of the socket and the CPU 14. The other end of the control loop 26 is coupled to power switches 28 which may include metal oxide semiconductor field effect transistors (MOSFETs). The output voltage is regulated by turning the switches 28 on and off under negative feedback control. Z1 and Z2 include inductors and decoupling capacitors to provide a low-pass filter for a dc/dc converter for the voltage regulator 12. In FIG. 1, the decoupling capacitor Z2 is shown mounted to the interposer 19, but it can also be placed on the package 18.

The power delivery system 10 can help reduce the problem of static and transient voltage droops when the CPU 14 needs power. By having the negative voltage feedback loop 26 sense the output voltage of the voltage regulator 12 at the interface of the socket 20 and the CPU 14, the system 10 is able to compensate for the impedance of the socket pins 24 which would otherwise exacerbate the voltage droop. That is, the impedance of the pins 24 of the socket 20 are incorporated in the design of the power delivery system 10 with appropriate adjustment of, for example, Z1 and/or Z2.

Figure 3:
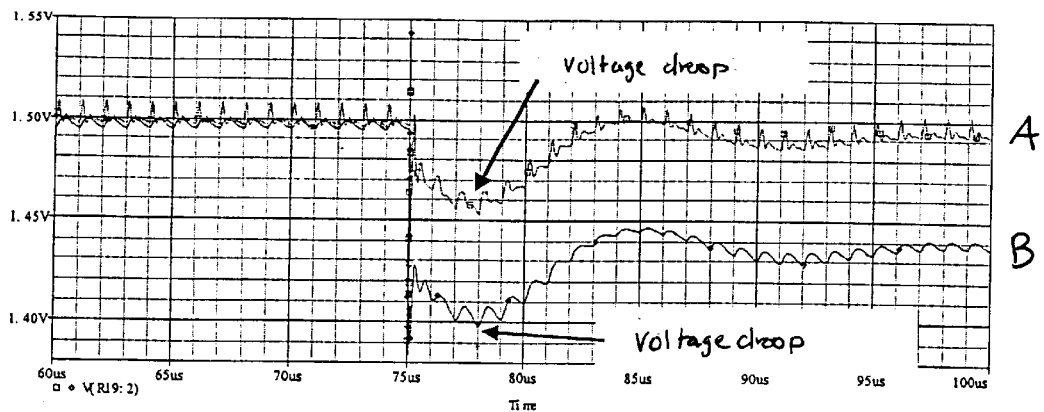
FIG. 3 is a simulated voltage performance graph.

An example of voltage droop is shown in FIG. 3 which is a graph illustrating a voltage performance simulation of the power delivery system 10 that compensates for the impedance of the socket pins 24 (simulation A) and a voltage performance simulation of a conventional power delivery system that does not compensate for the impedance of the socket pins (simulation B). For both simulations, the voltage regulator switching frequency was set at 1 megahertz (MHz), the current was set at 50-amp steps, and the value of the decoupling capacitor Z2 on the interposer 19 used was 24×100 microfarads ($\mu$F).

As shown in FIG. 3, simulation A shows a transient voltage droop of approximately 46 mV at around 78 $\mu$s. In contrast, the simulation B for the conventional system shows a transient droop of approximately 100 mV at 78 $\mu$s. Thus, the system 10 is able to produce a significant reduction in the voltage droop whenever the CPU 14 requires power.

Figure 4:
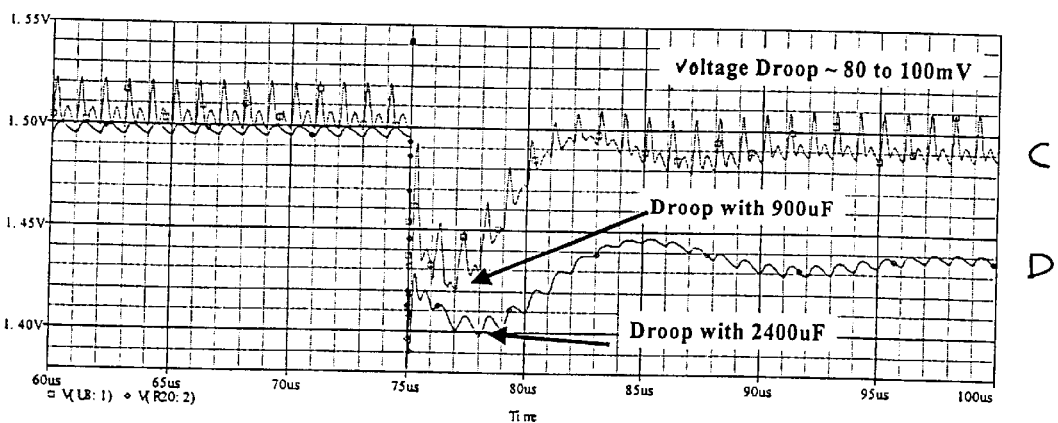
FIG. 4 is a simulated voltage performance graph using different decoupling capacitors.

FIG. 4 shows a voltage performance simulation of the power delivery system 10 with the decoupling capacitor Z2 set to a value of 900 $\mu$F (simulation C) and a voltage performance simulation of a conventional power delivery system with a corresponding decoupling capacitor set to a value of 2400 $\mu$F (simulation D). The corresponding decoupling capacitor of the conventional system would be located on the baseboard and not on the socket 20 or the package 18. The CPU load was kept the same for both simulations. The graph shows that the system 10 with the smaller decoupling capacitor Z2 still has a smaller voltage droop problem than the conventional system. One advantage of using a smaller decoupling capacitor is that the cost of the system 10 can be controlled because the cost of multiple layer ceramic capacitors (MLCCs) used in power delivery systems increase in price with increasing capacitive value.

Placing the decoupling capacitor Z2 on the socket 20 or on the package 18 is further made possible because the required decoupling value is significantly reduced as power technology is pushed to higher voltage regulator switching frequencies, for example, 5000 $\mu$F at 25 kHZ to 800 $\mu$F at 3 MHz. A decoupling capacitor of lower capacitive value is easier and less expensive to locate near a CPU. Furthermore, locating the decoupling capacitor closer to the CPU results in less interconnect inductance and, therefore, less voltage droop.

The system 10 can alleviate the voltage droop problem without radically changing the interface between the CPU 14 and the baseboard 22. It overcomes the problem of voltage droop by incorporating the socket impedance as part of the voltage regulator output filter and sensing the output voltage 12 of the voltage regulator at the interface of the CPU 14 and the socket 20. This technique can be further extended to any power delivery device through a connector to enhance its performance.

Other implementations are within the scope of the claims.

What is claimed is:

1. An apparatus comprising:
   a socket having an impedance to couple and deliver power to an electronic component;
   a voltage control sensor coupled to the socket to sense an output voltage at the socket and to provide negative feedback control, whereby an impedance of the socket is incorporated into the negative feedback control.

2. The apparatus according to claim 1 comprising a decoupling capacitor having an end coupled to a junction between the socket and the component.

3. The apparatus according to claim 2 wherein the decoupling capacitor comprises a capacitor located on the socket.

4. The apparatus according to claim 1 wherein the socket includes pins, and the voltage control sensor is coupled to one or more pins of the socket.

5. The apparatus device according to claim 1 wherein the socket is coupled to a CPU to deliver power to the CPU.

6. The apparatus according to claim 1, wherein the socket is a CPU socket.

7. The apparatus according to claim 1 comprising a baseboard on which the socket and the voltage control sensor are disposed.

8. The apparatus according to claim 1 comprising a switch coupled to the voltage control sensor at an end away from the socket and coupled to the socket through another decoupling capacitor.

9. A power delivery device comprising:
 a socket to receive a CPU; and
 a voltage regulator to provide regulated voltage to the CPU through the socket, the voltage regulator comprising:
  a voltage control sensor coupled to the socket to sense an output voltage at the socket and to provide negative feedback control; and
  a first decoupling capacitor coupled to a junction between the socket and the CPU.

10. The power delivery device according to claim 9 wherein the first decoupling capacitor comprises a capacitor disposed on the socket.

11. The power delivery device according to claim 9 wherein the socket include pins, and the voltage control sensor is coupled to one or more of the pins.

12. The power delivery device according to claim 9 comprising a baseboard on which the socket and the voltage regulator are disposed.

13. The power delivery device according to claim 9 wherein the voltage regulator comprises a switch coupled to the voltage control sensor at an end away from the socket and coupled to the socket through a second decoupling capacitor.

14. The power delivery device according to claim 13 wherein the first decoupling capacitor, the second decoupling capacitor and pins of the socket comprise to form a low pass filter.

15. A method of regulating power comprising:
 delivering power to an electronic component through a socket;
 sensing an output voltage at the socket; and
 providing negative feedback control based on the sensed voltage and an impedance of the socket.

16. The method according to claim 15 comprising:
 providing a capacitor coupled to a junction between the socket and the component to adjust for the impedance of the socket.

17. The method according to claim 15 further comprising:
 switching a voltage on and off to regulate the voltage as an output for power to the electronic component through the socket.

* * * * *